United States Patent [19]
Lin et al.

[11] Patent Number: 5,424,661
[45] Date of Patent: Jun. 13, 1995

[54] SENSOR CIRCUIT

[75] Inventors: San L. Lin, San Jose, Calif.; Hwa-Jyun Chen, Shinchu, Taiwan, Prov. of China

[73] Assignee: Winbond Electronics North America Corp., San Jose, Calif.

[21] Appl. No.: 106,098

[22] Filed: Aug. 12, 1993

[51] Int. Cl.⁶ .................... G01R 19/00; H03L 7/00; H03K 5/19
[52] U.S. Cl. ..................... 327/18; 327/20; 327/141; 327/162
[58] Field of Search .......... 307/269, 362, 363, 557, 307/568, 518

[56] References Cited

U.S. PATENT DOCUMENTS

| | | | |
|---|---|---|---|
| 3,614,522 | 10/1971 | Halinski | 307/269 |
| 3,995,272 | 11/1976 | Prill | 343/106 R |
| 4,910,703 | 3/1990 | Ikeda | 307/269 |
| 5,041,738 | 8/1991 | Walters | 307/269 |
| 5,151,613 | 9/1992 | Satou | 307/269 |

*Primary Examiner*—William L. Sikes
*Assistant Examiner*—Tiep H. Nguyen
*Attorney, Agent, or Firm*—Skjervan, Morrill, MacPherson, Franklin & Friel; Andrew C. Graham

[57] ABSTRACT

A sensor circuit is disclosed for use with a clock circuit providing a periodic timing signal to a clock output, wherein a timing reference for the periodic timing signal is provided by a crystal connected between a crystal input and a crystal output of the clock circuit, or alternatively provided by an external periodic logic signal coupled to the crystal input. The sensor circuit provides a sensor output in a first state, thereby indicating the presence of an external periodic logic signal timing reference, in response to at least a given number of large-signal voltage transitions on the crystal input within a certain period of time, and otherwise provides a second state on the sensor output, typically to indicate the presence of a crystal timing reference. Also disclosed is a clock circuit including a sensor circuit, and further including means for disabling a feedback resistor necessary for crystal operation when the timing reference is determined to be provided by an external periodic logic signal.

26 Claims, 5 Drawing Sheets

SENSOR CIRCUIT

BACKGROUND OF THE INVENTION

1. Field of the Invention

This invention relates to timing circuits, and more specifically, to a clock circuit for digital circuits.

2. Description of Related Art

Many electronic circuits process timing or frequency information. Examples of such circuits are real time clock circuits, timer circuits, frequency counter circuits, and function generator circuits. Crystal oscillators are widely used to provide a periodic timing signal to such electronic circuits to provide a timing or frequency reference which is necessary for such electronic circuits. Similarly, most digital circuits, particularly sequential circuits, also utilize such a time reference or frequency reference.

A typical crystal oscillator circuit is depicted in FIG. 1. Crystal input 150 is coupled to the input of gain block 100, which is typically a negative gain block implemented by a CMOS or NMOS inverter, and whose output is coupled to crystal output 160. The crystal input 150 and crystal output 160 are often referred to as "Xi" and "X2", respectively, on a variety of commercially available devices. A feedback resistor 106, which serves to bias the gain block 100 in a linear, high-gain region of operation, and a crystal 108 are each connected between the crystal input 150 and the crystal output 160. The value of feedback resistor 106 is typically within the range from 50 k ohms to 1M ohm. A capacitor 102 is connected between the crystal input 150 and a power supply terminal 110, and a capacitor 104 is similarly connected between the crystal output 160 and the power supply terminal 110. Capacitors 102 and 104 are each typically several picofarads. The crystal output 160 is coupled directly or by one or more buffering stages (not shown) to a clock output 180, which is coupled to the electronic circuits that utilize the periodic timing signal generated on the clock output 180.

In operation, the oscillator circuit of FIG. 1 oscillates at a frequency determined by the resonant frequency of the crystal 108 and provides a periodic digital output signal at that frequency to clock output 180. This signal is typically amplified or buffered and distributed to a variety of individual circuit blocks.

Often the timing or frequency reference to the oscillator circuit is provided by another electronic circuit rather than by a crystal. As shown in FIG. 2, an external periodic logic signal, generated by circuit 200, is coupled to the crystal input 150 and provides the timing reference instead of a crystal 108, which is absent in the configuration shown in FIG. 2. In this operation, gain block 100 operates as a digital inverter when driven by a sufficiently high amplitude signal, such as a CMOS or TTL level logic signal, and the clock output 180 provides a periodic timing signal as before to the variety of circuit blocks connected to clock output 180.

Often it is useful to know whether the timing reference of the oscillator circuit is provided by a crystal or by an external periodic logic signal. For instance, if the circuit is configured as in FIG. 2 where an external periodic logic signal provides the timing reference, and where gain block 100 operates as a digital inverter, the feedback resistor 106 is unnecessary for proper functionality and consumes unnecessary power. Such power dissipation can be reduced if the feedback resistor 106 is removed from its feedback path. As another example, certain modes of operation of a digital circuit may depend upon the source of the timing reference, such as when a circuit must synchronize its operation with other circuits sharing the same timing reference.

However, since the oscillator will not be biased for self-oscillation if the feedback resistor 106 is removed from the feedback path, any decision circuitry must be carefully designed to provide the feedback path unless the presence of an external logic signal timing reference can be firmly established.

SUMMARY OF THE INVENTION

It is an object of the present invention to provide a sensor circuit for use with a clock circuit providing a periodic timing signal to a clock output, wherein the sensor circuit provides a sensor output to indicate typically whether the timing reference for the periodic timing signal is provided by a crystal connected between a crystal input and a crystal output of the clock circuit, or alternatively provided by an external periodic logic signal coupled to the crystal input.

It is a further object of the present invention for the sensor output to not indicate the presence of an external periodic logic signal timing reference in response to a DC voltage present on the crystal input, as well as for a logic signal on the crystal input of a frequency below a certain frequency.

It is yet a further object of the present invention to provide semiconductor process tolerance in the operation of the sensor circuit.

Accordingly, a sensor circuit for use with a clock circuit provides a sensor output in a first state to indicate the presence of an external logic signal timing reference to the clock circuit, and otherwise provides the sensor output in a second state to indicate typically the presence of a crystal timing reference. A buffer is provided having an input coupled to a crystal input of the clock circuit, having an output, and having an input threshold voltage offset from the input threshold voltage of a negative gain block of the clock circuit. A transition detector is coupled to the buffer output and generates a transition detector output pulse in response to a logic transition of the buffer output. A gating means is connected to the transition detector output and has an output coupled to the sensor output, for providing the first state on the sensor output in response to at least a given number of transition detector output pulses within a period of time, and for providing the second state on the sensor output in response to a number of transition detector output pulses less than the given number within the period of time.

DETAILED DESCRIPTION OF THE PREFERRED EMBODIMENTS

Figure 3:
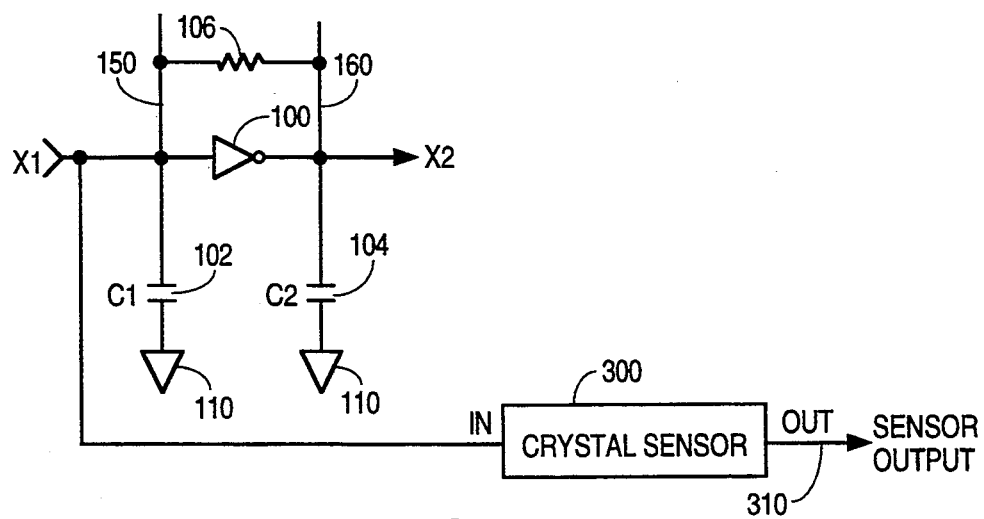
FIG. 3 is a schematic diagram of the prior art clock circuit of FIG. 1 with a block diagram of a sensor circuit in accordance with the present invention.

FIG. 3 depicts a sensor circuit 300 whose input is connected to crystal input 150 of the clock circuit. A sensor output 310 is provided to indicate the presence or absence of an external periodic logic signal timing reference to the clock circuit. The sensor circuit 300 responds to the difference in the voltage level of crystal input 150 when a crystal is used (biased by resistor 106 to a voltage approximately equal to the input threshold of gain block 100) and when an external periodic logic signal timing reference is used (being a large-signal logic waveform having substantially TTL voltage levels of 0.8 volts and 2.0 volts or greater, or having substantially CMOS voltage levels).

Figure 4:
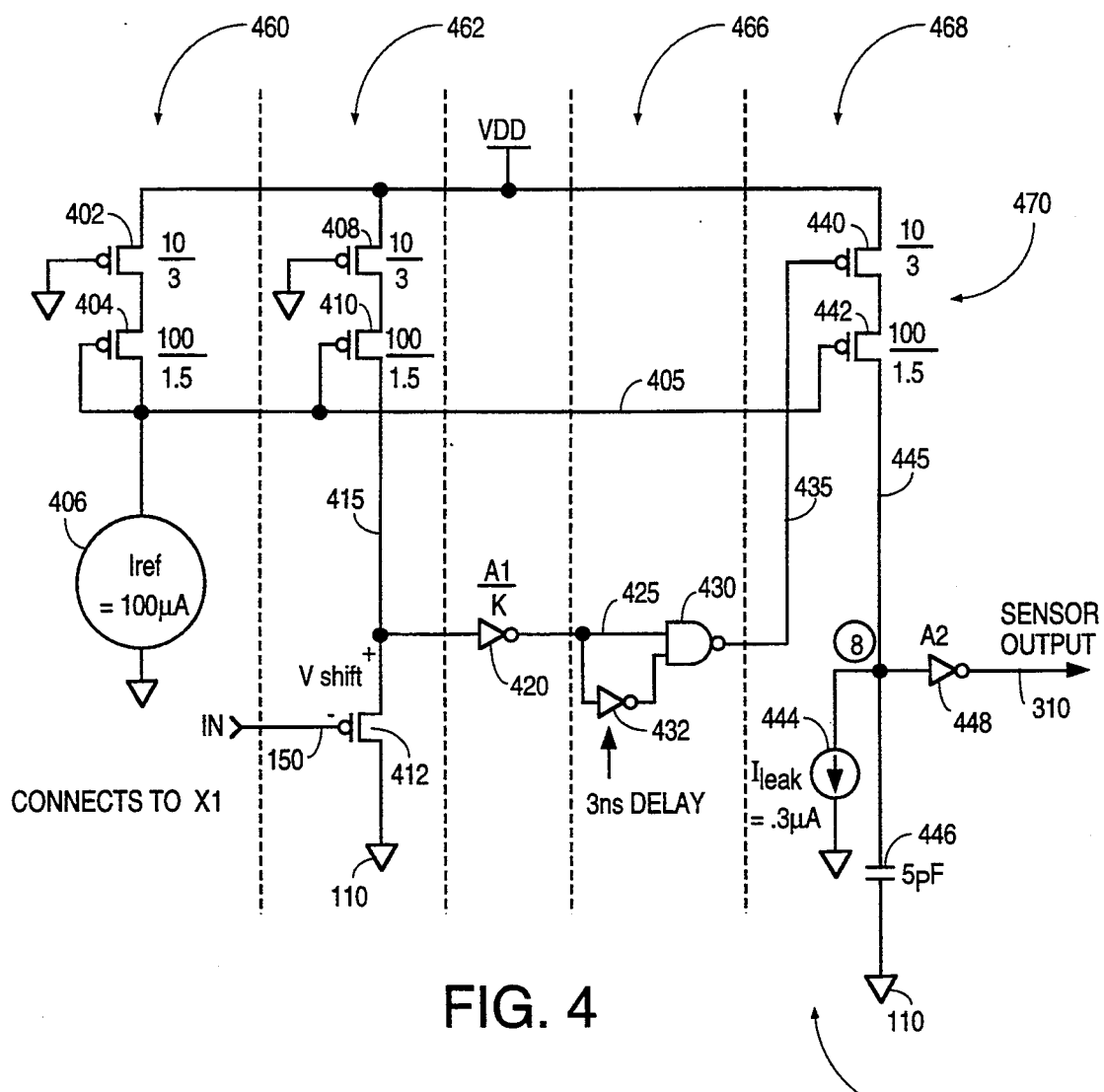
FIG. 4 is a schematic diagram of a sensor circuit in accordance with the current invention.

FIG. 4 depicts a crystal sensor circuit 300 in accordance with the current invention. A bias network 460 includes P-channel transistors 402 and 404, and reference current source 406. These three devices serve to generate a bias potential on bias node 405. The crystal input 150 is connected to a level-shifting stage 462 which includes P-channel transistor 412, and P-channel current mirror transistors 408 and 410. Bias node 405 is connected to the gate of P-channel transistor 410 and generates a current flowing through transistors 408 and 410 which mirrors the magnitude of current, $I_{REF}$, of the reference current source 406. With the crystal input 150 connected to the gate of P-channel transistor 412, a level shifter output 415 is generated which tracks the voltage of crystal input 150, but shifted positively by an amount determined by the ratios of transistors 408, 410 and 412. This level shifter output 415 is then connected to a gain block 420 which is constructed to have the same input threshold as does gain block 100 of the clock circuit itself. The gain block output 425 is connected to a transition detector 466 which includes NAND gate 430 and delay stage 432. The transition detector output 435 is connected to an integrating stage 468, and specifically to the gate of a P-channel transistor 440 which forms, along with P-channel transistor 442 whose gate is connected to bias node 405, a switched current source 470, equal in magnitude to the reference current 406 ($I_{REF}$) due to the current mirroring configuration, but switchable by the logic state on transition detector output 435 to selectively enable or disable the flow of current into an integrating node 445. A current source 444 is connected to the integrating node 445, as is an integrating capacitor 446. The integrating node 445 is then coupled to a buffer 448 which provides the sensor output 310.

Figure 1:
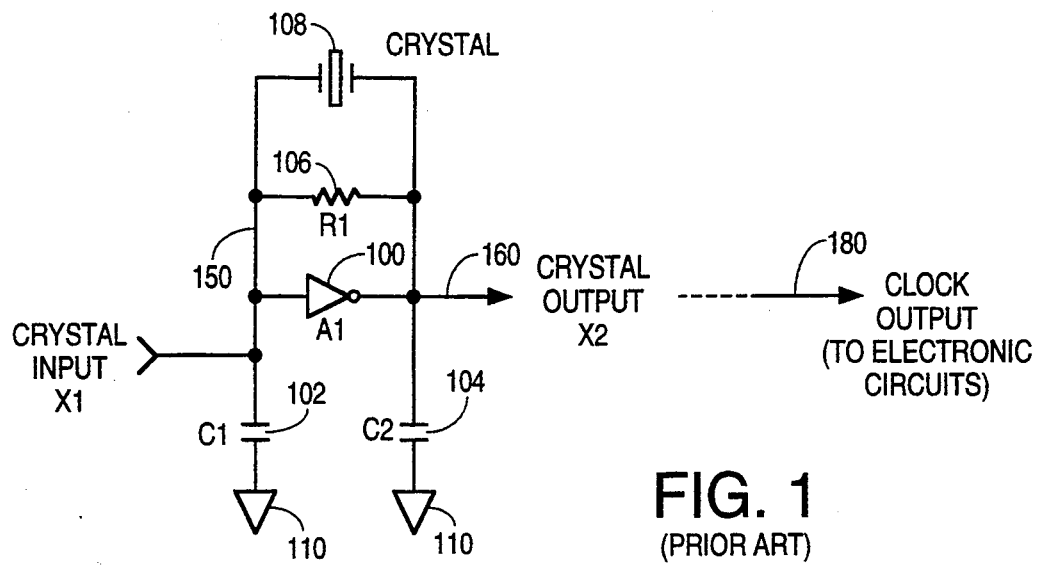
FIG. 1 is a schematic diagram of a prior art clock circuit configured as a crystal oscillator.
Figure 2:
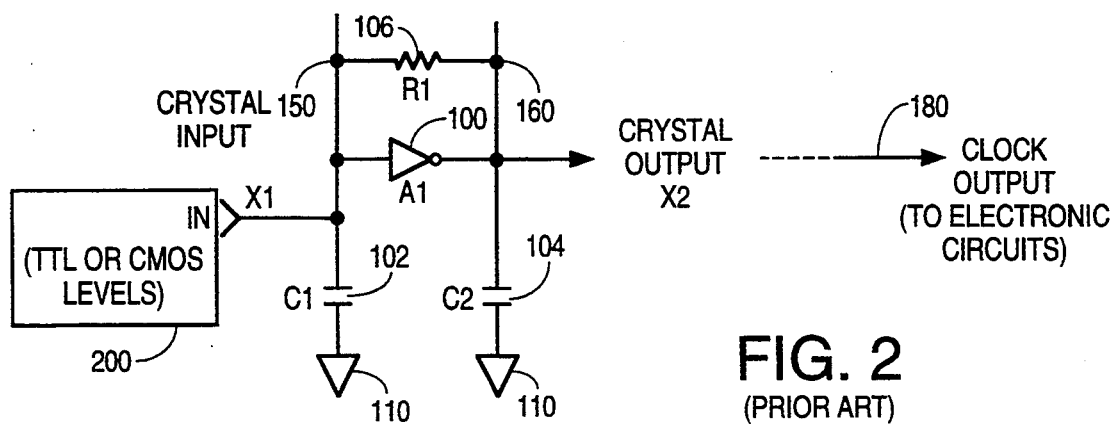
FIG. 2 is a schematic diagram of the prior art clock circuit of FIG. 1 configured with an external logic signal timing reference.
Figure 5:
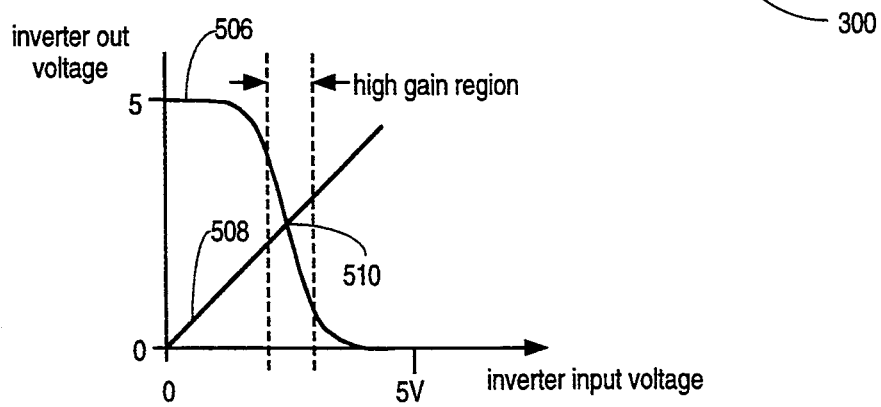
FIG. 5 is a chart which plots the input/output characteristics of an inverter.

When using a crystal oscillator for the timing reference, the clock circuit connections are as shown in FIG. 1. The voltage of crystal input 150 remains near the input threshold of gain block 100, being biased by the feedback resistor 106. When the input voltage of the gain block is biased near the input threshold voltage, the gain block is said to be biased in a high gain region. A plot of the input/output characteristics of a typical gain block (e.g., a CMOS inverter) is shown in FIG. 5 and illustrates the input threshold of such a gain block. The input threshold (or input threshold voltage) is defined as the voltage on the input which produces an equal voltage on the output. The intersection 510 of the 45° line 508 (diagramming the points on FIG. 5 where the inverter input voltage could equal the inverter output voltage) with the input/output transfer curve 506 defines the threshold voltage of the gain block.

Referring again to FIG. 4, when the crystal input 150 is biased near the input threshold voltage of gain block 100, the bias voltage of level shifter output 415 is higher than the bias voltage of crystal input 150. Since gain block 420 has the same input threshold as gain block 100, and since the voltage of level shifter output 415 is biased above the input threshold of gain block 420, the gain block output 425 is driven low. With no transitions occurring on gain block output 425, the transition detector output 435 is driven to a constant high voltage by NAND gate 430. Consequently, P-channel transistor 440 is off. No current flows through the switched current source 470, and the voltage on the integrating capacitor 446 remains at ground potential due to the current flow through current source transistor 444, which acts as a "leaker" to keep the voltage of the integrating capacitor 446 at ground potential in the absence of current flow through the switched current source 470 (transistors 440 and 442). Since the switched current source 470 is off, the voltage of integrating node 445 remains low and is inverted by inverter 448 to generate a high voltage on sensor output 310.

Alternatively, when the timing reference to the clock circuit is provided by an external periodic logic signal coupled to the crystal input 150, the voltage of the crystal input 150 is periodically driven to near ground potential for either a CMOS or a TTL level external signal. Consequently, even though the voltage of level shifter output 415 is positively shifted above the voltage of crystal input 150, the voltage of level shifter output 415 periodically falls below the input threshold voltage of gain block 420, and causes the gain block output 425 to transition to a high voltage. Thus, the gain block output 425 transitions to a high voltage in response to the crystal input 150 being driven to a low voltage. Specifically, the gain block output 425 is a periodic signal of the same frequency as, but out of phase with, the external logic signal provided to the crystal input 150, provided, however, that the low-level voltage of the external logic signal is lower than the input threshold voltage of the gain block 420 reduced by the offset incurred in the level shifter 462 (or lower than the range of 0.8 to 2.0 V for a TTL-compatible external logic signal).

The transition detector 466 (NAND gate 430 and delay stage 432) responds to every rising edge of gain block output 425 by generating, for this embodiment, a three-nanosecond long low-going pulse on transition detector output 435. Thus, a three-nanosecond low-going pulse is generated on transition detector output 435 for every instance of a falling edge on crystal input 150 (one per each period, $T_{REF}$, of the external periodic logic signal). This low-going pulse turns on P-channel transistor 440, thus enabling the switched-current source 470 (transistors 440 and 442) and causing a current, equal to the reference current $I_{REF}$ flowing through the reference current source 406, to flow into the integrating node 445. The integrating capacitor 446 integrates the pulsed currents flowing into integrating node 445 and causes the voltage on node 445, $V_{445}$, to rise at an average rate given by equation 1.

$$\frac{dV_{445}}{dt} = \frac{I_{REF}}{5 \text{ pF}} \times \frac{2 \text{ ns}}{T_{REF}} \quad \text{(Eq. 1)}$$

This average rate of voltage rise occurs, because every $T_{REF}$ the voltage of integrating node 445 increases by an amount equal to $I_{REF}/5\text{pF}*3\text{ns}$ volts. When this rising voltage reaches the input threshold of inverter 448, $V_T(448)$, the sensor output 310 goes low to indicate that the timing reference for the clock circuit is being provided by an external periodic logic signal. The magnitude $I_{REF}$ of reference current source 406, the value of integrating capacitor 446, and the duration of each of the low-going pulses generated on the transition detector output 435 can be varied according to the desired external frequency and the allowable delay times before this circuit responds to the presence of an external periodic logic signal.

The number of input cycles required from the time the sensor circuit starts integrating to the time that the sensor output goes low is given by equation 2.

$$\text{Cycles} = \frac{V_T(448)}{I_{REF} \times 3 \text{ ns}} \times 5 \text{ pF} \quad \text{(Eq. 2)}$$

When a sensor circuit is designed to require too many of these cycles, the response time of the sensor output is unnecessarily long. Conversely, when a circuit is designed to require too few of these cycles, the sensor circuit could be falsely triggered by noise.

Figure 6A:
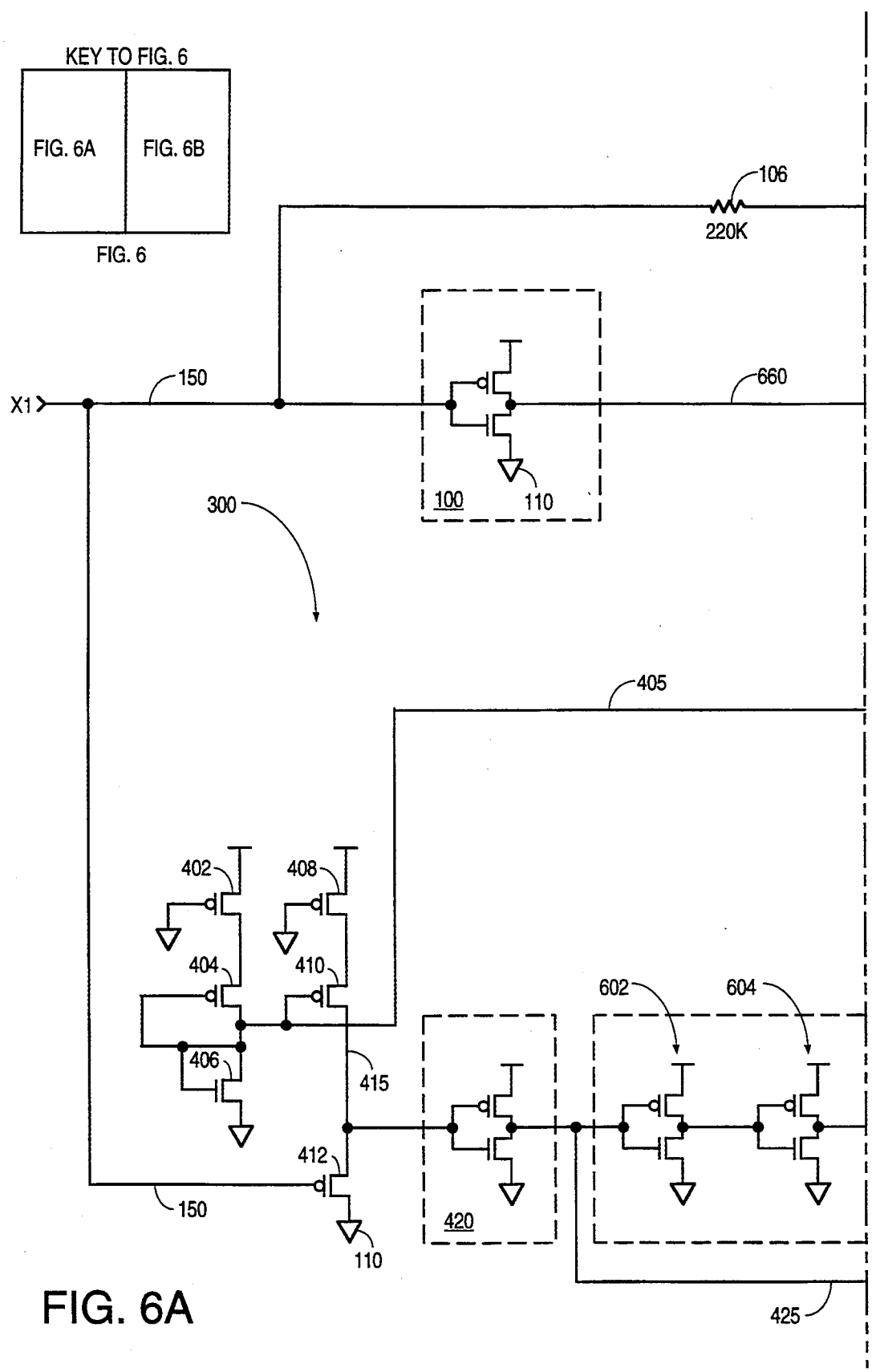
FIG. 6 is a schematic diagram of a clock circuit incorporating a sensor circuit in accordance with the current invention.
Figure 6B:
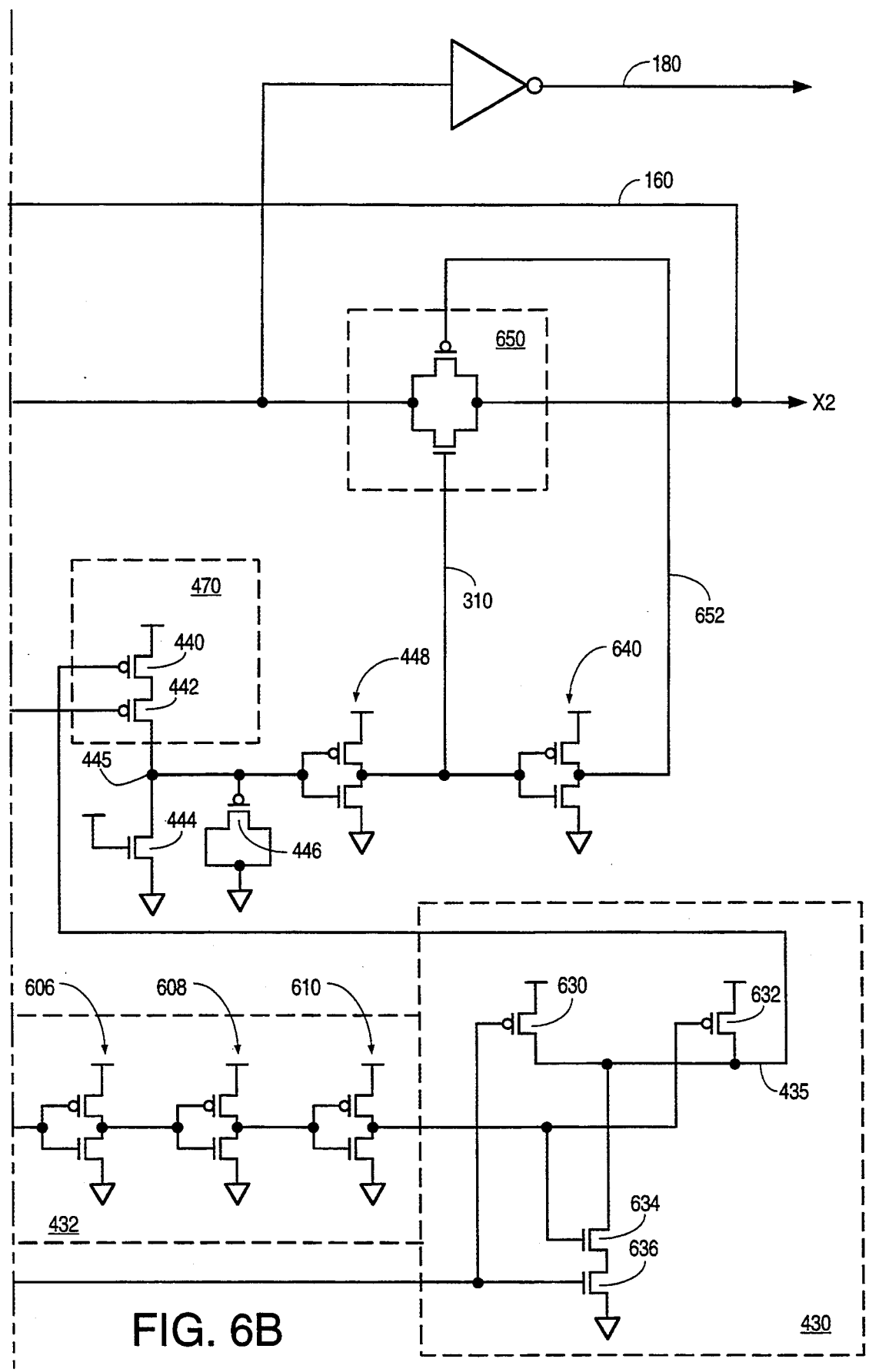

FIG. 6 depicts an embodiment of a clock circuit, including a sensor circuit 300 in accordance with the current invention, and further including means for disabling the feedback resistor when the timing reference is provided by an external periodic logic signal. A transfer gate 650 connects an output 660 of gain stage 100 to the crystal output 160, and is controlled by the sensor output 310 and a complementary sensor output 652 (which is generated by an inverter 640 connected to the sensor output 310). The gain blocks 100 and 420 are implemented as CMOS inverters having identical N-to-P transistor ratios. The delay stage 432 is implemented by an odd number of serially-connected inverters 602, 604, 606, 608, and 610, to result in an inverting delay stage. NAND gate 430 is conventionally implemented by P-channel transistors 630 and 632, and by N-channel transistors 634 and 636. Preferred transistor sizes for each of the transistors of the embodiment of FIG. 6 are given in Table 1 for a representative CMOS process.

TABLE 1

| Element | $W_p/L_p$ (μ) | $W_n/L_n$ (μ) | Other |
| --- | --- | --- | --- |
| gain block 100 | 1300/4 | 500/4 | |
| gain block 420 | 300/3 | 100/3 | |
| transistor 402 | 10/3 | — | |
| transistor 404 | 100/1.5 | — | |
| transistor 406 | — | 3/4 | |
| transistor 408 | 10/3 | — | |
| transistor 410 | 100/1.5 | — | |
| transistor 412 | 200/1.5 | — | |
| transistor 440 | 10/3 | — | |
| transistor 442 | 100/1.5 | — | |
| transistor 444 | — | 3/400 | |
| transistor 446 | 99/99 | — | (5pf capacitor) |
| transistor 630 | 15/1.5 | — | |
| transistor 632 | 15/1.5 | — | |
| transistor 634 | — | 11.5/1.5 | |
| transistor 636 | — | 11.5/1.5 | |
| inverter 448 | 30/1.5 | 23/1.5 | |
| inverter 602 | 15/1.5 | 11.5/1.5 | |
| inverter 604 | 15/1.5 | 11.5/1.5 | |

TABLE 1-continued

| Element | $W_p/L_p$ (μ) | $W_n/L_n$ (μ) | Other |
| --- | --- | --- | --- |
| inverter 606 | 15/1.5 | 11.5/1.5 | |
| inverter 608 | 15/1.5 | 11.5/1.5 | |
| inverter 610 | 15/1.5 | 11.5/1.5 | |
| inverter 640 | 30/1.5 | 23/1.5 | |
| pass gate 650 | 400/1.5 | 200/1.5 | |
| resistor 106 | | | 220Kohm |

Figure 7:
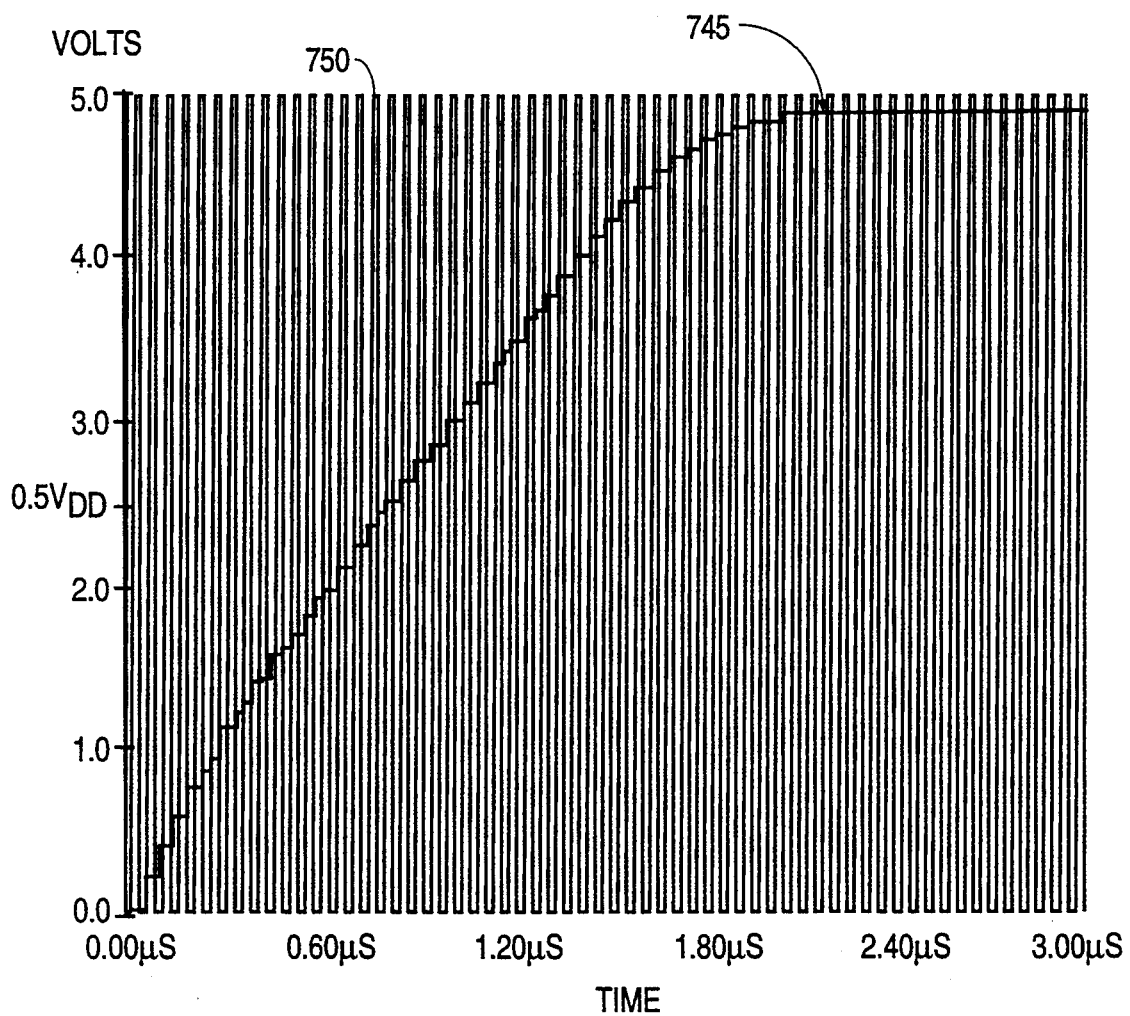
FIG. 7 is a chart which plots voltage waveforms of the clock circuit shown in FIG. 6, in response to an external logic signal timing reference.

FIG. 7 depicts voltage waveforms showing the circuit of FIG. 6 in operation responding to an external periodic logic signal timing reference. As can be seen, the voltage of integrating node 445 (shown as waveform 745) ramps in stair-step like fashion due to the finite quantity of charge conducted by the switched current source 470 (transistors 440 and 442) with each falling edge of the crystal input 150, and shows the voltage of integrating node 445 reaching a final potential, for this example, after approximately 40 cycles of the external periodic logic signal coupled to the crystal input 150 (shown as waveform 750). By requiring many cycles of such an external periodic logic signal before disabling the feedback path necessary for crystal operation, the sensor circuit is very immune to any noise on the crystal input 150 that might otherwise accidentally trigger the circuit. As such, this particular embodiment is configured to provide every opportunity for the circuit operation to be deemed as in the crystal mode unless many cycles of an external logic signal, having a low-level sufficiently below the input threshold voltage of the gain block, are received at crystal input 150, at which point the sensor circuit determines the clock circuit to be in an external timing reference mode and disables the feedback path.

A distinct advantage of a sensor circuit in accordance with this invention is the ability to have any DC level present on the crystal input node 150 and still drive the sensor output as if a crystal is present. The sensor circuit is not merely level sensitive to the voltage of crystal input 150, but instead requires a predetermined number of large-signal voltage transitions to occur on the crystal input node 150 within a certain period of time before driving the sensor output to indicate the presence of an external periodic logic signal timing reference. The circuit is self-resetting if an external periodic logic signal previously applied to the crystal input 150 is removed, or if the voltage of the crystal input 150 becomes a DC voltage. The sensor output also resets to indicate a crystal reference if the number of large-signal voltage transitions on the crystal input 150 is less than the predetermined number within the certain period of time.

While it is customary for an external logic signal timing reference to be a periodic square wave (or nearly so), it should be appreciated from the above discussion that the sensor circuit does not impose such a strict requirement upon the external logic signal, for the sensor output 310 switches generally based upon a minimum number of transitions of an external logic signal occurring within a certain period of time.

Another distinct advantage of this embodiment of such a sensor circuit is the tolerance to semiconductor process variations due to the matched input thresholds of gain block 100 and gain block 420, and due to the level shifter 462 (having all P-channel transistors) driving the gain block 420. Even as process parametrics vary and cause a varying input threshold voltage of these two gain blocks, the level shifter 462 still generates a high level on the level shifter output 415 sufficient to cause a DC low level on the gain block output 425 when the crystal input 150 is biased near the input threshold voltage of gain block 100, as it would be when biased for crystal feedback mode.

While the invention has been described with respect to the embodiments set forth above, the invention is not necessarily limited to these embodiments. For example, a counter could be used in conjunction with a delay circuit to determine whether the number of transitions of the crystal input 150 per unit time is sufficient to indicate the presence of an external periodic logic signal timing reference. Accordingly, other embodiments, variations, and improvements not described herein are not necessarily excluded from the scope of the invention, which is defined by the following claims.

What is claimed is:

1. A sensor circuit for use with a clock circuit providing a periodic timing signal to a clock output, wherein a timing reference for the periodic timing signal is provided by a crystal connected between a crystal input and a crystal output of the clock circuit, or alternatively provided by an external logic signal coupled to the crystal input, wherein the clock circuit includes a negative gain block having an input coupled to the crystal input, having an output coupled to both the clock output and the crystal output, and having an input threshold voltage corresponding to a voltage on the input which produces an equal voltage on the output, the sensor circuit for providing a sensor output in a first state to indicate a presence of an external logic signal timing reference, and otherwise in a second state, comprising:
    a buffer, having an input coupled to the crystal input, having an output, and having an input threshold voltage offset from the input threshold voltage of the clock circuit negative gain block;
    a transition detector having an input coupled to the buffer output and having an output, for generating an output pulse in response to a logic transition of the buffer output; and
    gating means having an input connected to the transition detector output and having an output coupled to the sensor output, for providing the first state on the sensor output in response to at least a given number of transition detector output pulses within a period of time, and for providing the second state on the sensor output in response to a number of transition detector output pulses less than the given number within the period of time.

2. A sensor circuit as in claim 1 wherein the buffer comprises:
    a level shifter having an input connected to the buffer input and having an output, for generating on the output a voltage which tracks a voltage of the input, but offset by a predetermined amount; and
    a second negative gain block, having an input connected to the level shifter output, an output coupled to the buffer output, and having an input threshold voltage matched to the input threshold voltage of the negative gain block of the clock circuit.

3. A sensor circuit as in claim 2 wherein the gating means comprises:
    an integrating node coupled to the sensor output;
    an integrating capacitor connected to the integrating node;
    a first current source, connected between a first power supply terminal and the integrating node in a direction to supply current to the integrating node, having an enable input coupled to the transition detector output for gating the first current source to conduct during a transition detector output pulse; and
    a second current source, connected between the integrating node and a second power supply terminal in a direction to draw current from the integrating node, for providing a discharge path from the integrating node to the second power supply terminal.

4. A sensor circuit as in claim 3 wherein the transition detector comprises:
    a delay stage having an input connected to the transition detector input and having an output; and
    a logic gate having a first input connected to the transition detector input, having a second input connected to the delay stage output, and having an output connected to the transition detector output.

5. A sensor circuit as in claim 4 wherein the delay stage comprises an odd number of serially-connected inverters and wherein the logic gate comprises a NAND gate.

6. A sensor circuit as in claim 3 wherein the first current source comprises:
    a seventh transistor having a source terminal connected to a first power supply terminal, a gate terminal connected to the transition detector output, and a drain terminal connected to a third intermediate node; and
    an eighth transistor having a source terminal connected to the third intermediate node, a gate terminal connected to the bias node, and a drain terminal connected to the integrating node;
    wherein the second current source comprises a ninth transistor having a source terminal connected to the second power supply terminal, a gate terminal connected to the first power supply terminal, and a drain terminal connected to the integrating node.

7. A sensor circuit as in claim 6 wherein the seventh and eighth transistors comprise P-channel MOS transistors, and wherein the ninth transistor comprises an N-channel MOS transistor.

8. A sensor circuit as in claim 2 wherein the level shifter comprises:
    a third current source connected between a first power supply terminal and the level shifter output; and
    a first transistor having a gate connected to the level shifter input; a first current-handling terminal connected to the level shifter output, and a second current-handling terminal connected to a second power supply terminal.

9. A sensor circuit as in claim 8 wherein the third current source comprises:
    a bias node;
    a second transistor having a source terminal connected to a first power supply terminal, a gate terminal connected to a second power supply terminal, and a drain terminal connected to a first intermediate node;
    a third transistor having a source terminal connected to the first intermediate node, and a gate terminal and drain terminal both connected to the bias node;
    a fourth transistor having a source terminal connected to the second power supply terminal, and a gate terminal and drain terminal both connected to the bias node;

a fifth transistor having a source terminal connected to the first power supply terminal, a gate terminal connected to the second power supply terminal, and a drain terminal connected to a second intermediate node; and a sixth transistor having a source terminal connected to the second intermediate node, a gate terminal connected to the bias node, and a drain terminal connected to the level shifter output.

10. A sensor circuit as in claim 9 wherein the first, second, third, fifth, and sixth transistors comprise P-channel MOS transistors, and wherein the fourth transistor comprises an N-channel MOS transistor.

11. A sensor circuit as in claim 2 wherein the clock circuit negative gain block and the second negative gain block each comprises a CMOS inverter, and the two CMOS inverters have substantially identical ratios of p-transistor size to n-transistor size.

12. A sensor circuit as in claim 11 wherein the buffer threshold voltage is within a range from 0.8 to 2.0 volts.

13. A clock circuit for providing a periodic timing signal to a clock output, wherein a timing reference for the periodic timing signal is provided by a crystal connected between a crystal input and a crystal output, or alternatively provided by an external logic signal coupled to the crystal input, and for providing a sensor output in a first state to indicate the presence of an external logic signal timing reference, and otherwise in a second state, comprising:

a first negative gain block having an input coupled to the crystal input, having an output coupled to the clock output and coupled to the crystal output, and having an input threshold voltage corresponding to a voltage on the input which produces an equal voltage on the output;

a buffer, having an input coupled to the crystal input, having an output, and having an input threshold voltage offset from the threshold voltage of the first negative gain block;

a transition detector having an input coupled to the buffer output and having an output, for generating an output pulse in response to a logic transition of the buffer output; and gating means having an input connected to the transition detector output and having an output coupled to the sensor output, for providing the first state on the sensor output in response to at least a given number of transition detector output pulses within a period of time, and for providing the second state on the sensor output in response to a number of transition detector output pulses less than the given number within the period of time.

14. A clock circuit as in claim 13 further comprising a CMOS transfer gate connecting the output of the first negative gain block to the crystal output, the transfer gate being controlled by the sensor output and configured in a manner to open the transfer gate in accordance with the first state of the sensor output, and to close the transfer gate in accordance with the second state of the sensor output.

15. A clock circuit as in claim 13 wherein the buffer comprises:

a level shifter having an input connected to the buffer input and having an output, for generating on the output a voltage which tracks a voltage of the input, but offset by a predetermined amount; and a second negative gain block, having an input connected to the level shifter output, an output coupled to the buffer output, and having an input threshold voltage matched to the input threshold voltage of the first negative gain block.

16. A clock circuit as in claim 15 wherein the gating means comprises:

an integrating node coupled to the sensor output;

an integrating capacitor connected to the integrating node;

a first current source, connected between a first power supply terminal and the integrating node in a direction to supply current to the integrating node, having an enable input coupled to the transition detector output for gating the first current source to conduct during a transition detector output pulse; and a second current source, connected between the integrating node and a second power supply terminal in a direction to draw current from the integrating node, for providing a discharge path from the integrating node to the second power supply terminal.

17. A clock circuit as in claim 16 wherein the transition detector comprises:

a delay stage having an input connected to the transition detector input and having an output; and a logic gate having a first input connected to the transition detector input, having a second input connected to the delay stage output, and having an output connected to the transition detector output.

18. A clock circuit as in claim 17 wherein the delay stage comprises an odd number of serially-connected inverters and wherein the logic gate comprises a NAND gate.

19. A clock circuit as in claim 16 wherein the first current source comprises:

a seventh transistor having a source terminal connected to a first power supply terminal, a gate terminal connected to the transition detector output, and a drain terminal connected to a third intermediate node; and an eighth transistor having a source terminal connected to the third intermediate node, a gate terminal connected to the bias node, and a drain terminal connected to the integrating node;

wherein the second current source comprises a ninth transistor having a source terminal connected to the second power supply terminal, a gate terminal connected to the first power supply terminal, and a drain terminal connected to the integrating node.

20. A clock circuit as in claim 19 wherein the seventh and eighth transistors comprise P-channel MOS transistors, and wherein the ninth transistor comprises an N-channel MOS transistor.

21. A clock circuit as in claim 15 wherein the level shifter comprises:

a third current source connected between a first power supply terminal and the level shifter output; and a first transistor having a gate connected to the level shifter input; a first current-handling terminal connected to the level shifter output, and a second current-handling terminal connected to a second power supply terminal.

22. A clock circuit as in claim 21 wherein the third current source comprises:

a bias node;

a second transistor having a source terminal connected to a first power supply terminal, a gate terminal connected to a second power supply terminal, and a drain terminal connected to a first intermediate node;

a third transistor having a source terminal connected to the first intermediate node, and a gate terminal and drain terminal both connected to the bias node;

a fourth transistor having a source terminal connected to the second power supply terminal, and a gate terminal and drain terminal both connected to the bias node;

a fifth transistor having a source terminal connected to the first power supply terminal, a gate terminal connected to the second power supply terminal, and a drain terminal connected to a second intermediate node; and a sixth transistor having a source terminal connected to the second intermediate node, a gate terminal connected to the bias node, and a drain terminal connected to the level shifter output.

23. A clock circuit as in claim 22 wherein the first, second, third, fifth, and sixth transistors comprise P-channel MOS transistors, and wherein the fourth transistor comprises an N-channel MOS transistor.

24. A clock circuit as in claim 15 wherein the first and second negative gain blocks each comprises a CMOS inverter, and the two CMOS inverters have substantially identical ratios of P-transistor size to N-transistor size.

25. A clock circuit as in claim 24 wherein the buffer input threshold voltage is within a range from 0.8 to 2.0 volts.

26. A clock circuit as in claim 25 further comprising a CMOS transfer gate connecting the output of the first negative gain block to the crystal output, the transfer gate being controlled by the sensor output and configured in a manner to open the transfer gate in accordance with the first state of the sensor output, and to close the transfer gate in accordance with the second state of the sensor output.

* * * * *